(12) United States Patent
Streppel et al.

(10) Patent No.: US 10,178,722 B2
(45) Date of Patent: Jan. 8, 2019

(54) LIGHTING DEVICE AND OPERATING METHOD FOR SUCH A LIGHTING DEVICE

(71) Applicant: OSRAM Opto Semiconductors GmbH, Regensburg (DE)

(72) Inventors: Ulrich Streppel, Regensburg (DE); Siegfried Herrmann, Neukirchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/863,766

(22) Filed: Jan. 5, 2018

(65) Prior Publication Data
US 2018/0206303 A1 Jul. 19, 2018

(30) Foreign Application Priority Data
Jan. 16, 2017 (DE) .......................... 10 2017 100 705

(51) Int. Cl.
*H01L 33/00* (2010.01)
*H05B 33/08* (2006.01)
(Continued)

(52) U.S. Cl.
CPC ..... *H05B 33/0827* (2013.01); *H05B 33/0842* (2013.01); *G02B 27/0955* (2013.01);
(Continued)

(58) Field of Classification Search
CPC ......... H01L 25/0756; H01L 2933/0033; H01L 33/10
(Continued)

(56) References Cited

U.S. PATENT DOCUMENTS

2001/0022495 A1* 9/2001 Salam ................ H01L 25/0756
313/499
2007/0018189 A1 1/2007 Chin et al.
(Continued)

FOREIGN PATENT DOCUMENTS

DE 102016119539 A1 4/2018
DE 102017100716 A1 7/2018

OTHER PUBLICATIONS

Samsung Introduces New Line-up of LED Components for Automotive Lighting, Featuring Chip-Scale Packaging; Business Wire; www.businesswire.com; Jun. 20, 2016.

*Primary Examiner* — Thuy Vinh Tran
(74) *Attorney, Agent, or Firm* — McDermott Will & Emery LLP

(57) ABSTRACT

A lighting device (1) and an operating method for the lighting device (1), which comprises at least one base chip (21) and a plurality of cover emitter regions (22). The base chip or chips (21) and the cover emitter regions (22) are realized by light-emitting diode chips and are electrically controlled independently of one another. Main emission directions (M) of these light-emitting diode chips are oriented parallel to one another. The cover emitter regions (22) are partially overlapping with the at least one base chip (21), so that an overlap region (3, B) is formed and the at least one base chip (21) radiates through the cover emitter regions (22) during operation. The cover emitter regions (22) are arranged in a common plane perpendicular to the main emission directions (M).

15 Claims, 10 Drawing Sheets

Figure 1E:
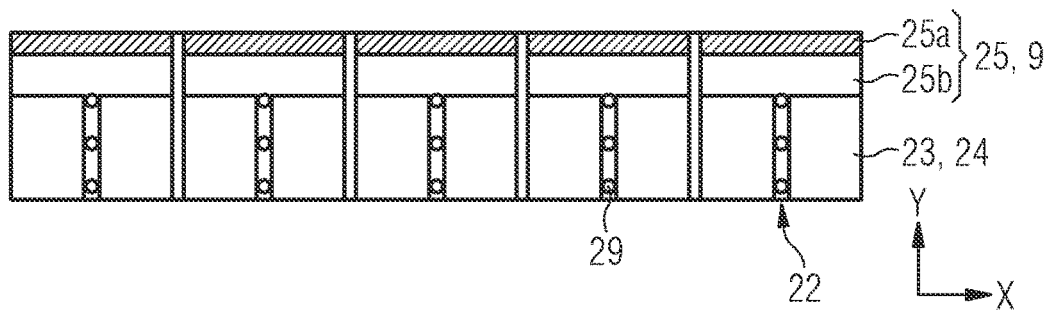

(51) Int. Cl.
    *H01L 25/075*    (2006.01)
    *H01L 33/10*     (2010.01)
    *G02B 27/09*     (2006.01)
(52) U.S. Cl.
    CPC ...... *G02B 27/0977* (2013.01); *H01L 25/0756* (2013.01); *H01L 33/10* (2013.01); *H01L 2933/0033* (2013.01)
(58) Field of Classification Search
    USPC .......................................................... 257/98
    See application file for complete search history.

(56)         References Cited

U.S. PATENT DOCUMENTS

| 2008/0121902 | A1  | 5/2008  | Sackrison et al. |
| 2010/0084668 | A1  | 4/2010  | Choi et al. |
| 2012/0168799 | A1* | 7/2012  | Hassan ................... F21K 9/00 257/98 |
| 2013/0221392 | A1  | 8/2013  | Engl et al. |
| 2014/0054618 | A1  | 2/2014  | Li |
| 2016/0027980 | A1  | 1/2016  | Hahn et al. |

* cited by examiner

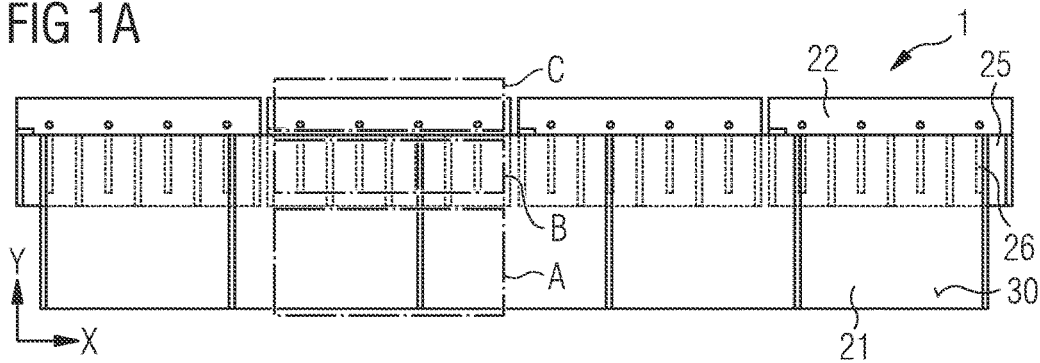
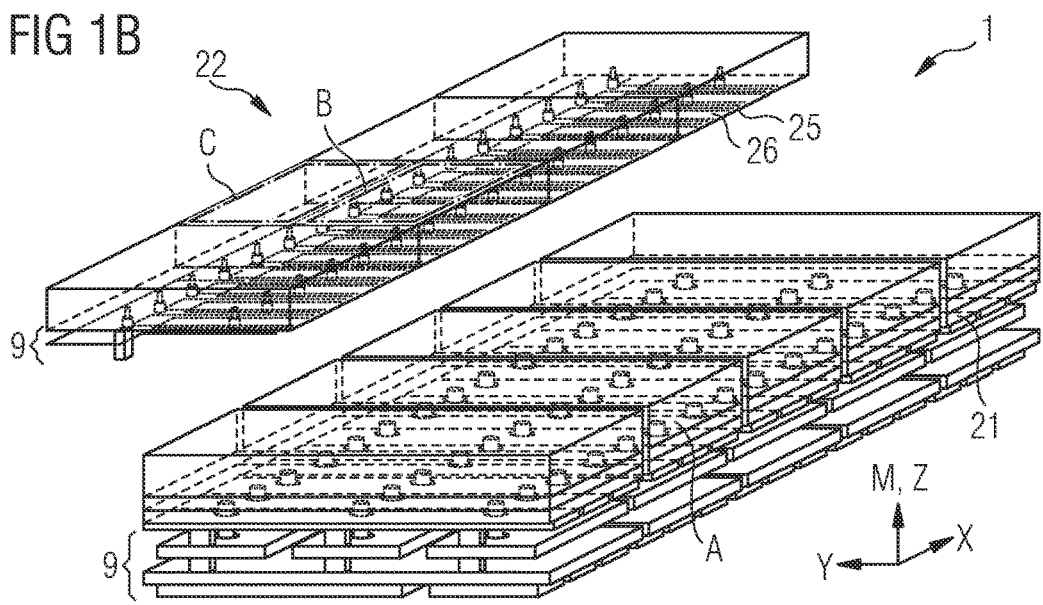
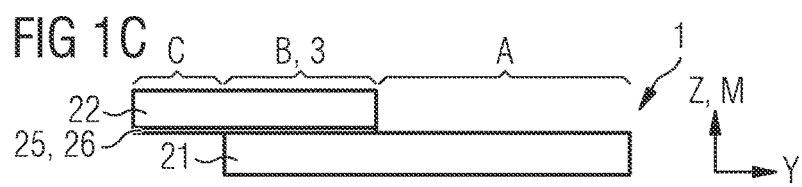
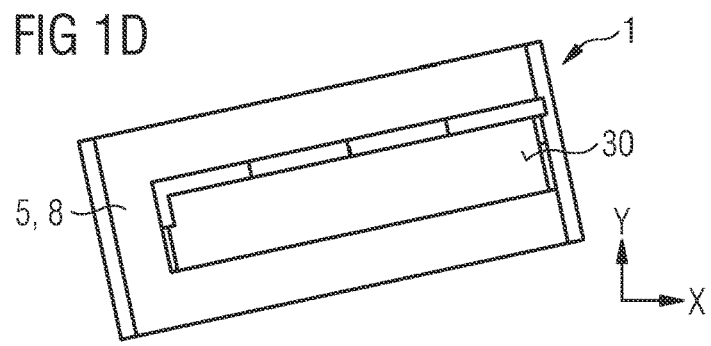

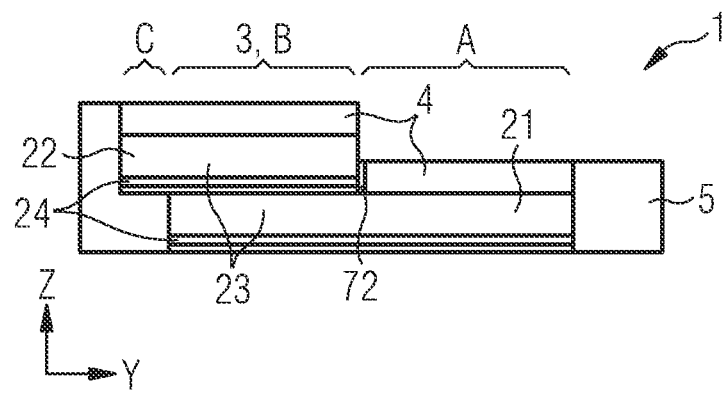
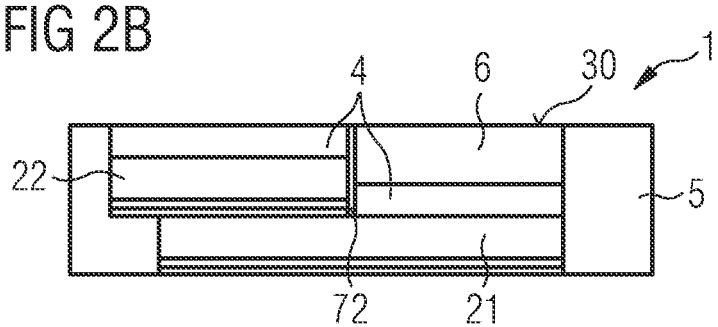
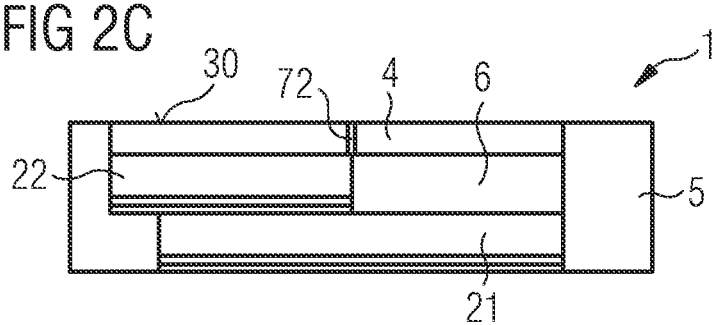

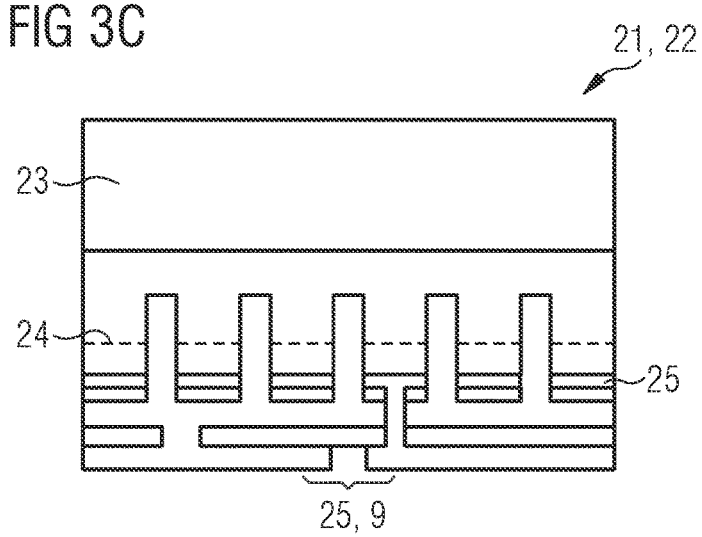
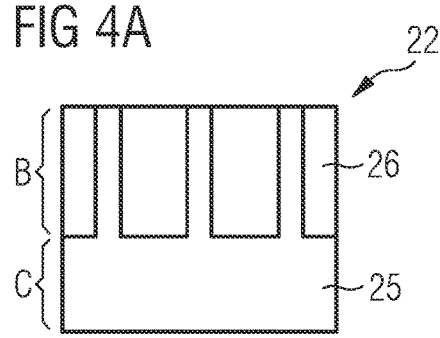
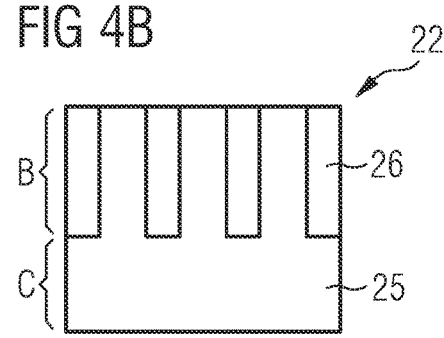
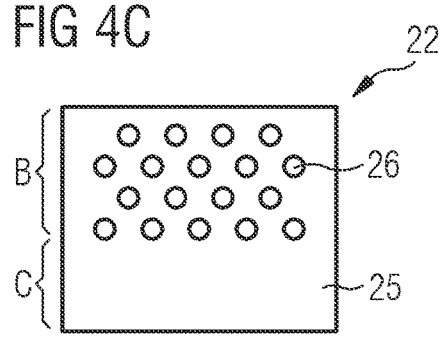
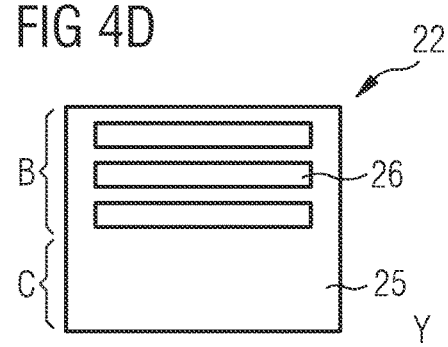

LIGHTING DEVICE AND OPERATING METHOD FOR SUCH A LIGHTING DEVICE

The invention relates to a lighting device. The invention further relates to an operating method for such a lighting device.

An aim of the invention is to provide a cost-effective lighting device, which can be used as a variable light source for a basic illumination and for a point illumination.

This object is achieved, inter alia, by a lighting device and by an operating method having the features of the independent patent claims. Preferred developments are the subject-matter of the dependent claims.

According to at least one embodiment, the lighting device comprises one or more base chips. In addition, the lighting device comprises a plurality of cover emitter regions. The cover emitter regions can each be realized by a cover chip, or all or more of the cover emitter regions are preferably combined in a cover chip. The at least one base chip and the cover emitter regions, that is the at least one cover chip, are in each case light-emitting diode chips.

According to at least one embodiment, the cover emitter regions and the base chips can be electrically controlled independently of one another. This preferably applies both to a group, that is to say within the base chips and within the cover emitter regions, and to the base chips and the cover emitter regions.

According to at least one embodiment, the used light-emitting diode chips have main emission directions which are oriented parallel to one another. The term "parallel" is to be understood here and below in particular as having an angular tolerance of at most 30° or 15° or 5°.

According to at least one embodiment, the cover emitter regions are arranged in a partially overlapping manner with the at least one base chip. In other words, when viewed in a plan view, the cover emitter regions partially cover the at least one base chip. The area in which the cover emitter regions are arranged on the base chip represents an overlap region.

According to at least one embodiment, the at least one base chip radiates through the at least one cover emitter region which is arranged on said base chip. This means that at least one radiation component from the base chip can only leave the lighting device through the cover emitter region. In particular, the cover emitter regions are irradiated by the base chip only in the overlap region or approximately only in the overlap region. In the overlap region, a beam direction of the base chips is aligned parallel or approximately parallel to the main emission direction through the at least one associated cover emitter region. This means that no or no significant beam expansion of the light originating from the at least one base chip takes place within the cover emitter regions.

According to at least one embodiment, the cover emitter regions are arranged in a common plane perpendicular to the main emission directions. In particular, the cover emitter regions terminate flush with one another along the main emission direction on a side facing the at least one base chip and/or facing away from the at least one base chip. The term "perpendicular" is to be understood as having the same tolerances as the term "parallel".

In at least one embodiment, the lighting device comprises at least one base chip and a plurality of cover emitter regions. In this case, the base chip or chips and the cover emitter regions are each realized by one or by a plurality of light-emitting diode chips and can be electrically controlled independently of one another. Main emission directions of these light-emitting diode chips are oriented parallel to one another. The cover emitter regions are arranged in a partially overlapping manner with the at least one base chip, so that an overlap region is formed and the at least one base chip radiates through the cover emitter regions during operation. The cover emitter regions are mounted in a common plane perpendicular to the main emission directions, wherein the at least one base chip is located in another plane.

The lighting device described here can be used in particular as a compact headlight, for example for motor vehicles. Adaptive features of a headlight can be implemented with this lighting device in an efficient and cost-effective manner. In addition to partial illumination of certain regions, a luminance can be increased in a positionally controlled manner by the described arrangement of the light-emitting diode chips. This makes it possible to highlight diffuse or focused emission characteristics or to superimpose them on one another without any mechanical components. Furthermore, it is possible to use such lighting devices with a controllable spatial radiation and angular emission for spatial illumination.

By means of the three available illumination modes, that is to say the operation of the at least one base chip alone, operating at least a part of the cover emitter regions and jointly operating the at least one base chip and at least one part of the cover emitter regions, different illumination properties can be realized. This is not possible when conventional light sources on a semiconductor basis are used, in which the individual units for the light-emitting diodes, viewed in plan view, are arranged only next to one another or congruently one above the other. In addition, a considerable cost reduction is possible in particular in comparison with fine-pixel adaptive front headlights based on individual micro-LEDs.

According to at least one embodiment, the at least one base chip and the cover emitter regions each have a continuous, contiguous active layer. The active layer is designed for generating light by means of electroluminescence. As a consequence, the at least one base chip radiates through the at least one active layer of the cover emitter regions during operation. In this case, no or no significant excitation of the active layer of the cover emitter regions is effected by radiation from the at least one base chip, so that no or no significant photoluminescence occurs within the cover emitter regions.

According to at least one embodiment, the cover emitter regions are located along the main emission directions close to the at least one base chip. A distance between the base chip and the cover emitter regions along the main emission directions is preferably at most 50% or 25% or 10% of a mean edge length of the at least one base chip. It is possible for the cover emitter regions to be applied directly to the base chip.

According to at least one preferred embodiment, a plurality of base chips are present. The base chips are particularly preferably arranged in a common plane. The plane of the base chips is arranged in particular perpendicular to the main emission directions.

According to at least one embodiment, the base chips and/or the cover emitter regions and/or the cover chips are arranged closely next to one another in their respective plane. This means that an intermediate space between adjacent base chips and cover emitter regions or cover chips in the respective plane is negligible compared to an edge length of these light-emitting diode chips. For example, this distance between adjacent light-emitting diode chips is at most 40% or 20% or 10% of the average edge length of the associated light-emitting diode chips.

According to at least one particularly preferred embodiment, the base chips, on the one hand, and/or the cover emitter regions, on the other hand, are monolithically formed from one single semiconductor chip and each have a common growth substrate, for example a sapphire substrate. In this case, the base chips and/or the cover emitter regions are formed by a pixel-shaped, larger chip which is divided into separately controllable active regions.

According to at least one embodiment, the base chip is formed by a segmented light-emitting diode chip. Alternatively or additionally, the cover emitter regions are realized by a segmented light-emitting diode chip, that is to say by the cover chip.

According to at least one embodiment, the lighting device has exactly one or at least 3 or 5 and/or at most 12 or 10 or 8 of the base chips. Alternatively or additionally, the number of cover chips is exactly one or at least 2 or 4 and/or at most 32 or 16 or 8. The number of cover emitter regions is preferably at least 3 or 4 and/or at most 32 or 16 or 8 or 6. It is possible that the same number of base chips and cover chips are present. Alternatively, the number of cover chips can exceed the number of base chips or vice versa.

According to at least one embodiment, the base chip is segmented into a plurality of base emitter regions. The base emitter regions can preferably be electrically controlled individually.

According to at least one embodiment, the base chips and/or the base emitter regions have a square or rectangular layout. An edge length of the base chips and/or of the base emitter regions is, for example, at least 500 μm or 800 μm and/or at most 2 mm or 1.5 mm. This applies in particular to applications in headlights. The cover chips and/or the cover emitter regions preferably have a smaller base area than the base chips and/or the base emitter regions and are preferably designed to be rectangular. A longitudinal extent of the cover chips and/or of the cover emitter regions can be oriented parallel to a longitudinal direction of the lighting device.

According to at least one embodiment, the lighting device is set up to be operated with currents of at least 0.8 A or 1 A and/or of at most 4 A or 2 A. This applies in particular to headlight applications. Said currents are preferably temporally averaged currents. The lighting device is designed in particular for permanent operation with such currents.

According to at least one embodiment, the lighting device has no further light sources in addition to the at least one base chip and the cover emitter regions. This means that, as intended, only light from the at least one base chip and the at least one cover chip with the cover emitter regions is emitted. It is possible that there are additional light-emitting components such as operating indicator lights that do not or not significantly contribute to an overall power consumption. In particular, "not significant" means a contribution of at most 1%.

According to at least one embodiment, the cover chips and/or the cover emitter regions and alternatively or additionally the base chips and/or the base emitter regions are arranged geometrically in a row. This means that the base chips or base emitter regions on the one hand and/or the cover chips or cover emitter regions on the other hand are located along a straight line. In this case, preferably precisely one or exactly two rows of base chips or base emitter regions and/or of cover chips or cover emitter regions are present.

According to at least one embodiment, the cover emitter regions and/or the at least one cover chip have a reflective contact structure on a side facing the at least one base chip. The contact structure is preferably formed by a metallization made of one or more metal layers. The contact structure is preferably impermeable to visible light.

According to at least one embodiment, the contact structure has one or more gaps in the overlap region. Through these gaps, the radiation generated by the at least one base chip enters the associated cover emitter region. In other words, the cover emitter region is radiated through these gaps by the at least one base chip. The gaps can, for example, be strip-shaped or point-shaped, seen in plan view.

According to at least one embodiment, outside the overlap region the contact structure of the cover emitter regions and/or of the cover chip is designed flat, without gaps and/or in a light-impermeable manner. In other words, the contact structure can represent a whole-area metal mirror for the respective cover emitter region or cover chip outside the overlap region.

According to at least one embodiment, the at least one base chip has a mirror layer on a side facing away from the cover emitter regions. The mirror layer is preferably formed by a metallic contact structure and preferably extends over the entire surface or substantially over the whole area over the associated base chip.

According to at least one embodiment, the cover emitter regions and the at least one base chip generate light of the same color during operation, within the scope of manufacturing tolerances. For example, the at least one base chip and the at least one cover chip are light-emitting diode chips for generating blue light. In particular, the at least one cover chip and the at least one base chip comprise a semiconductor layer sequence, which is based on the material system AlInGaN and which can be grown on a transparent substrate such as a sapphire growth substrate.

Alternatively, the cover emitter regions and the at least one base chip can generate light of different colors.

According to at least one embodiment, the lighting device comprises one or more phosphor layers. The at least one phosphor layer is designed to partially or completely absorb the light generated by the light-emitting diode chips and to convert it into light of a different, longer-wave color. The phosphor layer can contain organic or inorganic phosphors such as YAG:Ce. With the at least one phosphor layer, white light is preferably generated, together with blue light from the light-emitting diode chips.

According to at least one embodiment, the one or each phosphor layer has one or more steps. The at least one step is preferably located at a boundary between the overlap region and remaining regions of the at least one base chip. This means that the phosphor layer can be arranged on the cover emitter regions at a position along the main emission directions other than above the at least one base chip. In particular, it is possible for the phosphor layer to be at the same position along the main emission directions in the region above the at least one base chip as the cover emitter regions. In other words, the phosphor layer can lie above the at least one base chip in the same plane as the cover emitter regions, in particular in a common plane perpendicular to the main emission directions. The phosphor layer can extend continuously and contiguously over the step or be separated by the step into non-continuous sub-regions.

According to at least one embodiment, the lighting device comprises one or more light-transmissive planarization layers. The at least one planarization layer is preferably located on a side of the phosphor layer facing away from the at least one base chip. Alternatively or additionally, the planarization layer is partially or completely located between the phosphor layer and the at least one base chip. As a result, it is possible for a planar, flat light exit surface of the lighting device to be formed. The light exit side is preferably formed by the planarization layer alone or together with the phosphor layer. If the planarization layer is located between the phosphor layer and the at least one base chip, the light exit side is preferably formed solely by the flat and planar phosphor layer.

According to at least one embodiment, a first surface area, in which the at least one base chip is covered by the at least one cover chip with the cover emitter regions, amounts to at least 10% or 15% or 20% or 25%. Alternatively or additionally, the first surface area is at most 55% or 45% or 35%. In other words, the first surface area corresponds to the proportion of the area of the overlap region of the total area of the at least one base chip. The first surface area is preferably relatively small.

According to at least one embodiment, the surface of the overlap region forms a second surface area, relative to the total area of the cover emitter regions. The second surface area is at least 25% or 40% or 55% and/or at most 90% or 80% or 65%. In other words, the second surface area is relatively large.

According to at least one embodiment, the first surface area is smaller than the second surface area, relative to their percentages. In other words, the overlap region has a comparatively large surface area on the cover emitter regions and a comparatively small area proportion on the at least one base chip.

According to at least one embodiment, the at least one base chip and/or the cover emitter regions and/or the at least one cover chip are of rectangular or square shape in plan view. This preferably applies to the individual light-emitting diode chips and to the totality of the arrangement of the base chips and of the cover emitter regions.

According to at least one embodiment, the cover emitter regions project beyond the at least one base chip continuously along one side, seen in plan view. Alternatively or additionally, the cover emitter regions project beyond the at least one base chip on two mutually opposite sides completely or, preferably, only partially. It is possible that at a remaining, fourth side the cover emitter regions do not project beyond the at least one base chip.

According to at least one embodiment, the at least one base chip and the cover emitter regions are surrounded all around by a reflector potting when viewed in a plan view. The reflector potting is preferably integrally formed directly at the at least one base chip and at the cover emitter regions, so that the reflector potting can be in direct contact with the light-emitting diode chips. For example, the reflector potting is formed from a light-permeable matrix material with scattering particles contained therein, for example of $TiO_2$ or $Al_2O_3$. A reflectivity of the reflector potting is, in particular, at least 90% or 95% for white or blue light.

According to at least one embodiment, all electrical connections of the at least one base chip and/or of the cover emitter regions and/or of the at least one cover chip point in the same direction, in particular in the direction away from the phosphor layer. In other words, the at least one base chip and the at least one cover chip can be flip chips. The at least one base chip and the cover chip preferably each comprise a growth substrate, in particular a transparent growth substrate, for instance made of sapphire. The semiconductor layer sequence having the active layer is grown on the growth substrate. It is possible for each of the light-emitting diode chips to have a separate growth substrate, so that the growth substrate does not extend continuously over a plurality of the light-emitting diode chips.

According to at least one embodiment, the lighting device comprises one or more optical elements. Along the main emission direction, the at least one optical element is arranged downstream of the at least one base chip and/or the cover emitter regions, in particular jointly arranged downstream. The optical element is, for example, a lens or a mirror or a lens system or a mirror system. For example, the optical element is formed by one or more converging lenses or by one or more parabolic mirrors or paraboloid mirrors.

According to at least one embodiment, the optical element has different imaging properties for the at least one base chip on the one hand and the cover emitter regions on the other hand. This is achieved, for example, by virtue of the fact that the optical element has different focal lengths in areas associated to the at least one base chip and to the cover emitter regions. Alternatively or additionally, it is possible that the at least one base chip, on the one hand, and the cover emitter regions, on the other hand, have different distances from the optical element, in particular from a focal plane of the optical element. In this way, it can be achieved that the light of the at least one base chip and of the cover emitter regions is emitted out of the lighting focused differently or diffused differently.

According to at least one embodiment, the lighting device comprises one or more optical separation elements. A beam splitting with the at least one optical separation element can be achieved between light from the overlap region, light from the cover emitter regions outside the overlap region and/or light from the at least one base chip outside the overlap region. In other words, the separation element is an optical isolation, for example, in the phosphor layer and/or on the planarization layer and/or in a region between the light-emitting diode chips and the optical element.

The invention further relates to an operating method for operating such a lighting device. Features of the operating method are therefore also disclosed for the lighting device and vice versa.

In at least one embodiment of the operating method, at times the at least one base chip is operated alone and at times the at least one base chip and at least one or some or all of the cover emitter regions are operated together. In addition, it is possible for one or more or all of the cover emitter regions to be operated at times without the base chip or chips being turned off. As a result, it is possible for a basic illumination to be realized in particular by the at least one base chip. By means of the cover emitter regions, a region-wise, punctiform additional illumination can be realized. The additional illumination can partially or completely overlap with the basic illumination or can also lie entirely outside the region of the basic illumination.

It is possible for the lighting device to be operated only in such a way that in the switched-on state always at least one or all of the base chips generate light.

According to at least one embodiment of the operating method, the lighting device is used as a headlight, in particular of a motor vehicle such as a car. The at least one base chip is preferably used as a pre-field illumination. Alternatively or additionally, the cover emitter regions serve as a variable low-beam light. An adaptive function of the headlight can then be implemented by means of the cover emitter regions.

According to at least one embodiment of the lighting device, said lighting device is used for general lighting of rooms such as residential rooms or business rooms. By means of the lighting device, it is possible for a basic illumination of approximately the entire room to be achieved on the basis of the at least one base chip. By means of the additional illumination, specific areas of the room are illuminated in a targeted manner, for example a work surface such as a workbench or a desk or a placement area for certain goods.

According to at least one embodiment of the operating method, the lighting device is used as a light source such as a flash for a mobile telephone. By means of the additional illumination, specific regions of the region to be illuminated, in particular of the region to be photographed, can be illuminated more strongly, in order to compensate for fluctuations in the otherwise present ambient light or to set certain accents in the image, for example.

A lighting device described here and an operating method described here are explained in more detail below with reference to the drawing on the basis of exemplary embodiments. Identical reference signs indicate the same elements in the individual figures. In this case, however, no relationships to scale are illustrated, but rather individual elements can be represented with an exaggerated size in order to afford a better understanding.

Figure 7:
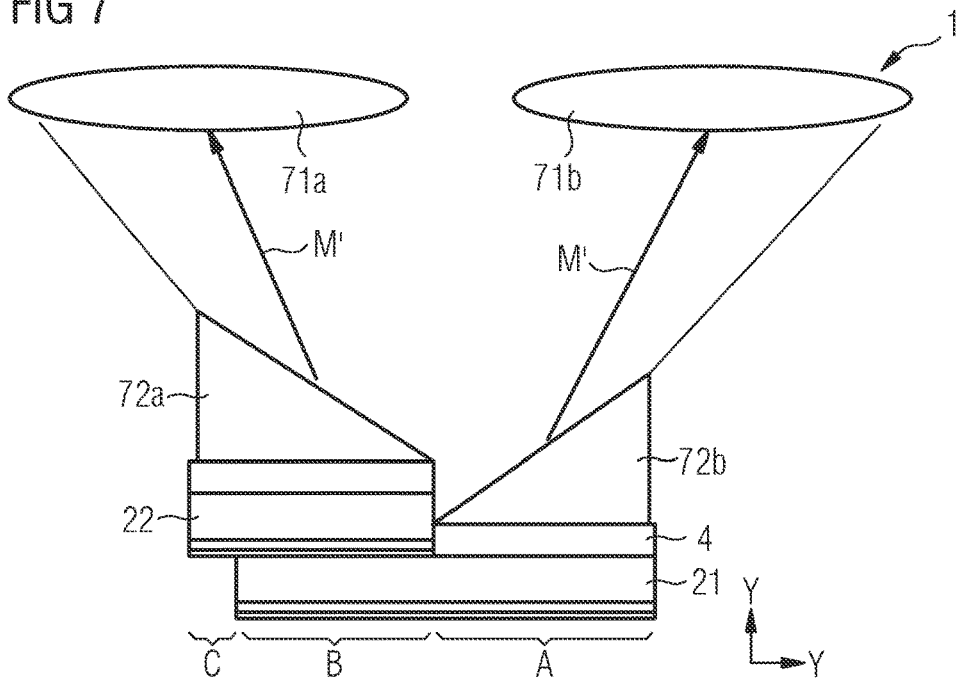
Figure 8:

In the drawing:

FIGS. 1A to 1G, 2A to 2C, 3A to 3C, 5 to 7, 9 to 10, 11A to 11B, 12A to 12B, 13A to 13B, 14 and 15A to 15C show schematic representations of exemplary embodiments of lighting devices described here, FIGS. 4A to 4D show a schematic plan view of exemplary embodiments of electrical contact structures for cover chips for lighting devices described here, and FIG. 8 shows a schematic sectional illustration of an optical element for an exemplary embodiment of a lighting device described here.

Figure 1F:
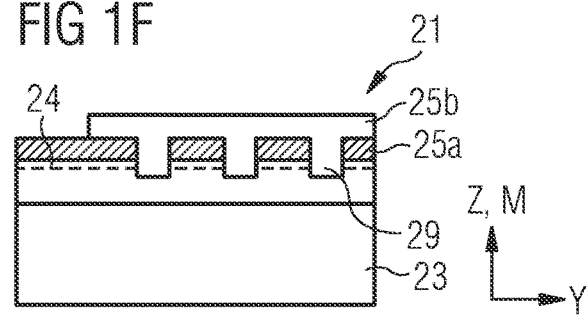
Figure 1G:
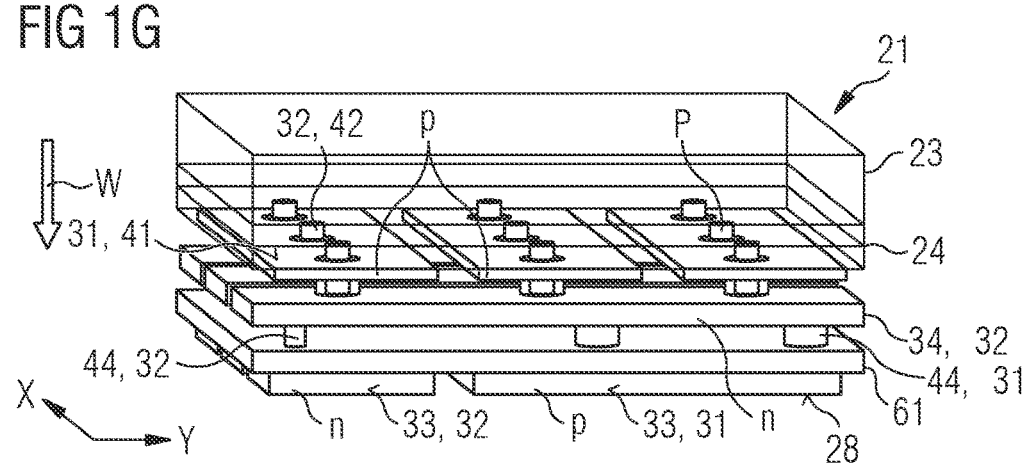

FIGS. 1A to 1G show an exemplary embodiment of a lighting device 1, see the top view in FIG. 1A, the exploded drawing in FIG. 1B, the sectional representations in FIGS. 1C and 1F, the perspective top view in FIG. 1D, the top view in FIG. 1E and the perspective illustration in FIG. 1G.

The lighting device 1 comprises a plurality of base chips 21 each having a base emitter region, see FIGS. 1A to 1D. Alternatively, see FIG. 1G, only one base chip 21 having a plurality of base emitter regions is present, as can accordingly also be the case in all other exemplary embodiments. The statements relating to exemplary embodiments having a plurality of separate base chips 21 each having only one base emitter region apply equally to exemplary embodiments having only one base chip 21 having a plurality of base emitter regions.

Furthermore, there are a plurality of cover emitter regions 22, which are realized by a common cover chip. The base chips 21 and the cover chip are each light-emitting diode chips. All of these light-emitting diode chips are preferably designed to generate blue light. Furthermore, preferably all the base emitter regions among one another and all the cover emitter regions 22 among one another are designed identically to one another.

The base emitter regions of the at least one base chip 21 and the cover emitter regions 22 are each arranged closely next to one another along a straight line. The base chip or the base chips on the one hand and the cover emitter regions 22 on the other hand are each located in a common plane perpendicular to a growth direction z of a semiconductor layer sequence of the light-emitting diode chips. The growth direction z is oriented parallel to main emission directions M of the light-emitting diode chips 21, 22.

Along the main emission directions M, the base emitter regions of the at least one base chip 21 are located in a first plane, which follows a second plane with the cover emitter regions 22. In this case, the cover emitter regions 22 are arranged in such a way that they cover the base chips 21 in an overlap region 3, B, seen in plan view. In the overlap region 3, B, radiation exits from the base chips 21, enters the cover emitter regions 22 and is radiated out of the lighting device 1 through the cover emitter regions 22. Due to this arrangement of the light-emitting diode chips 21, 22 a step occurs along a transverse direction y between the base chips 21 and the cover emitter regions 22. Preferably, no step occurs along a longitudinal direction x.

Three different light generation regions A, B, C thus result along the transverse direction y. In the first light-generating region A, radiation directly exits the base chips 21. In the second light-generating region B, when both the base chips 21 and the cover emitter regions 22 are switched on, an emission of light both from the base chips 21 and from the cover emitter regions 22 occurs. Otherwise, when the cover emitter regions 22 are switched off, the radiation from the base chip 21 is slightly changed in the second light-generating region B, for example with increased divergence. In the third light-generating region C, only radiation from the cover emitter regions 22 exits.

Optionally, it is possible for the third light-generating region C to extend over the entire cover emitter regions 22, when the base chips 21 are switched off. Preferably, the base chips 21 are always switched on in the intended operation of the lighting device 1 and the cover emitter regions 22 serve as additional switchable light sources for point-by-point, time-wise illumination of specific regions.

The cover emitter regions 22 each have an electrical contact structure 25. The contact structure 25 comprises a reflective metallization 25b, in particular as an n-type contact, and a light-transmissive contact layer 25a, in particular as a p-contact. In the second light-generating region B, the metallization 25b has a plurality of slot-shaped gaps 26. Through these gaps 26, the radiation from the base chips 21 enters the cover emitter regions 22 of the cover chip. The cover chip is thus coarsely pixelated, and the cover emitter regions 22 each form a single continuous luminous region during operation.

As in all other exemplary embodiments, it is alternatively possible that the base chips 21 in the second light-generating region B and in the third light-generating region C can be controlled independently of one another. As a result, further illumination functions can be realized by the lighting device 1.

In FIG. 1D, it can be seen that a light exit side 30 formed by the base chips 21 and the cover emitter regions 22, viewed in plan view, is surrounded all around by a reflector potting 5. The reflector potting 5 is, for example, a plastic such as a silicone, to which light-scattering and/or white particles, for instance made of titanium dioxide, are added. The reflector potting 5 is located on a support 8, which is not shown separately.

An electrical contacting 9 of the light-emitting diode chips 21, 22 is indicated only in a highly simplified manner in FIGS. 1A to 1D. The contacting 9 is illustrated in more detail in FIGS. 1E to 1G.

According to FIGS. 1E and 1F, the precisely one cover chip comprises all the cover emitter regions 22. Proceeding from the metallization 25b, plated-through holes 29 extend through the contact layer 25a and through an active zone 24 towards a growth substrate 23 for a semiconductor layer sequence comprising the active zone 24. Per cover emitter region 22, it is also possible for a plurality of rows of plated-through holes 29 to be present, in contrast to FIG. 1E.

An electrical insulation layer between the metallization 25b and the contact layer 25a is not shown in order to simplify the illustration. The semiconductor layer sequence with the active zone 24 can extend continuously over all the cover emitter regions 22 or can be partially or completely removed between adjacent cover emitter regions 22. The growth substrate 23, for example made of sapphire, extends continuously over all the cover emitter regions 22.

The cover chip comprising the cover emitter regions 22 is preferably constructed as described in document DE 10 2016 119 539 A1. The disclosure content of this document with regard to the design of the cover chip is incorporated by reference.

FIG. 1G illustrates a base chip 21 in which all the base emitter regions are monolithically integrated in a single light-emitting diode chip. Such base chips are preferably also used in all other exemplary embodiments. On the growth substrate 23, the semiconductor layer sequence with the active zone 24 is located between a first layer region, which is p-conducting, and a second layer region, which is n-conducting, for example.

On a side of the semiconductor layer sequence facing away from the growth substrate 23, there are a first electrical contact structure 31 and a second electrical contact structure 32. The first electric contact structure 31 is provided for electrically contacting the first layer region, and the second contact structure 32 is provided for electrically contacting the second layer region.

The first contact structure 31 has a plurality of, for example three, surface contacts 41, which follow one another along a y-direction and are located in a common plane along a growth direction W of the semiconductor layer sequence. The metallic surface contacts 41, which act as mirrors, are preferably in direct contact with the semiconductor layer sequence and are spaced apart from one another along the y-direction. The surface contacts 41 can be electrically controlled independently of one another. Each of the surface contacts 41 is connected via through-connections 44 to an electrical connection surface 33 on a bottom side 28 of the base chip 21 facing away from the growth substrate 23.

Proceeding from connection surfaces 33 for the second contact structure 32, through-connections 44 extend to contact webs 34. The contact webs 34 extend along the y-direction preferably continuously over the semiconductor layer sequence. The three contact webs 34, for example, can be controlled electrically independently of one another via the connection surfaces 33 of the second contact structure 32. Proceeding from the contact webs 34, contact pins 42 extend through the surface contacts 41, through the first layer region and through the active zone into the second layer region and end in the latter. In this case, a plurality of, for example three, contact pins 42 are preferably provided for each surface contact 41.

The surface contacts 41 comprising a plurality of contact pins 42 each result in a plurality of luminous areas. Between adjacent surface contacts 41, the luminous regions are sharply delimited from one another, since the first layer region has only negligible electrical transverse conductivity, so that in plan view, alongside the surface contacts 41, no significant current flow is generated.

Since the second layer region has a good lateral current conductivity, the luminous regions smoothly merge into one another along the x-direction, along which the surface contacts extend continuously. In other words, the surface contacts 41 are embodied as column contacts along the x-direction, and the contact webs 34 are embodied as row contacts along the y-direction. By means of corresponding contacting and shaping of the connection surfaces 33, the individual light regions of the base chip 21 can be controlled individually or in groups. In this case, it is possible, as in all other exemplary embodiments, for an only simplified electrical interconnection to be carried out, so that only certain segment images and thus certain combinations of luminous regions are illuminated during operation. Because of the comparatively small number of connection surfaces, for example a maximum of nine or six connection surfaces 33, a simple application-oriented interconnection is possible.

In order to simplify the illustration, electrical insulation layers between the contact structures 31, 32 are not illustrated in FIG. 1G. Short circuits are prevented via such electrical insulations. In FIG. 1G, only one electrically insulating support layer 61 is illustrated, on which the connection surfaces 33 are located.

FIGS. 2A to 2C show schematic sectional representations along the transverse direction y of further exemplary embodiments of the lighting devices 1. The lighting devices 1 each comprise a phosphor layer 4. The different configurations of the phosphor layer 4 as shown in FIGS. 2A to 2C can be applied analogously to all other exemplary embodiments.

In the exemplary embodiment of FIG. 2A, the phosphor layer 4 has a step which extends at the edge of the overlap region 3, B to the base chip 21. Thus, a separate region of the phosphor layer 4 is assigned to the cover emitter regions 22. Optionally, an optical separation element 72 is located on the phosphor layer 4 above the base chip 21 and towards the cover emitter regions 22, for example an opaque coating, which can be reflecting or also absorbing.

In the exemplary embodiment of FIG. 2B, a planarization layer 6 is present above the base chip 21. Thus, the light exit side 30 is shaped flat and composed of the planarization layer 6 together with the phosphor layer 4 on the cover emitter regions 22. Here, too, an optical separation element can be located between the planarization layer 6 and the associated phosphor layer 4 as well as between the cover emitter regions 22 and the associated phosphor layer 4. The light exit side 30 preferably terminates flush with the reflector potting 5.

According to FIG. 2C, the planarization layer 6 is located between the phosphor layer 4 and the base chip 21, so that the light exit side 30 is completely formed by the phosphor layer 4. The phosphor layer 4 can extend continuously and contiguously over the light-emitting diode chips 21, 22. The optical separation element 72 is optionally present, which can be limited to the phosphor layer 4 or can extend to the base chip 21 analogously to FIG. 2B.

Figure 3A:
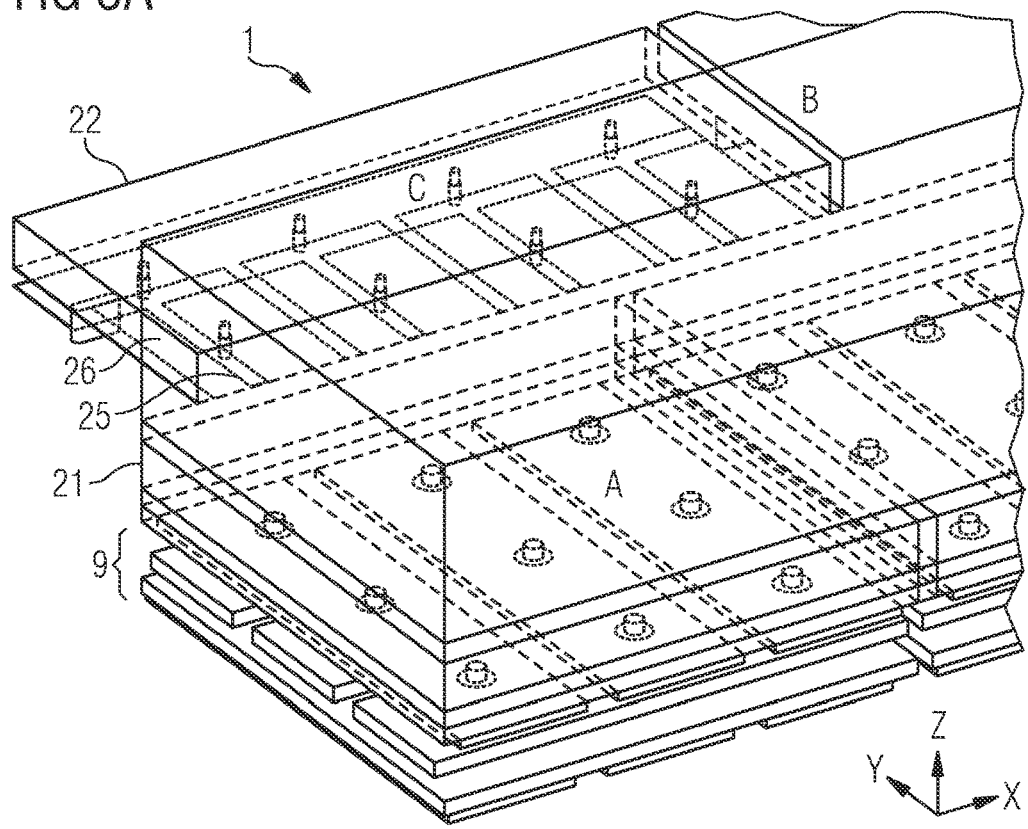
Figure 3B:
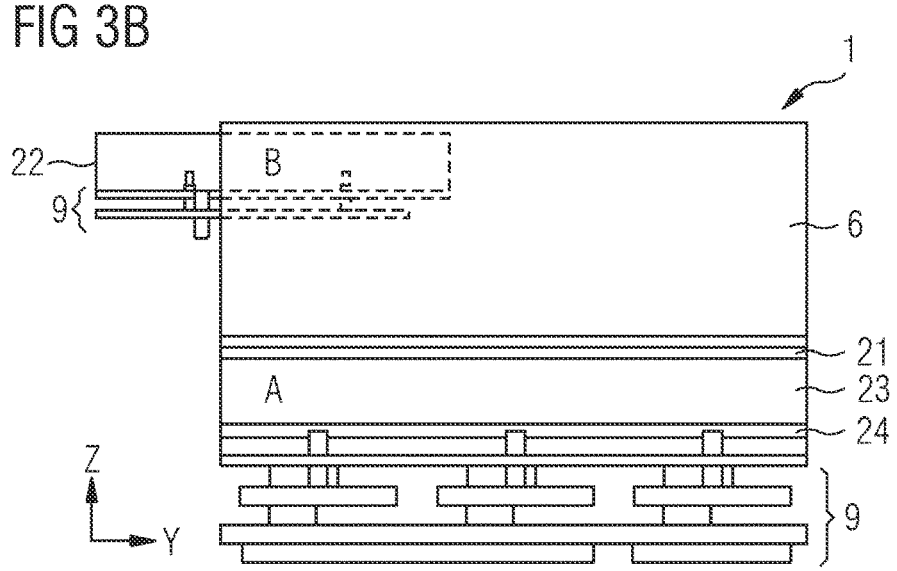

FIGS. 3A to 3C show a further exemplary embodiment of the lighting device 1 in more detailed representations. Unless otherwise indicated, the exemplary embodiment of FIGS. 3A to 3C corresponds to that of FIGS. 1A to 1G. FIG. 3A shows a perspective representation; in FIG. 3B a sectional view along the transverse direction y and in FIG. 3C a detailed sectional view of the light-emitting diode chips 21, 22 are shown.

The light-emitting diode chips 21, 22 are constructed, for example, as specified in document US 2013/0221392 A1. This is illustrated in particular in FIG. 3C, but can also be seen in FIG. 3B. The semiconductor layer sequence having the active layer 24 is grown on the growth substrate 23. The substrate 23 is, for example, a sapphire substrate, and the semiconductor layer sequence is based, in particular, on the material system AlInGaN.

From one side of the electrical contacting 9, the active layer 24 is penetrated by a plurality of plated-through holes, which end in an n-conducting side. An electrical contact for a p-side on a side of the active layer 24 facing the contacting 9 preferably forms the reflective contact structure 25. In order to simplify the illustration, insulation layers, in particular on the plated-through holes, are not specifically shown in FIG. 3C.

In FIGS. 4A to 4D, exemplary embodiments of the contact structure 25 are shown in schematic plan views, in particular of the contact structure 25 directly on the semiconductor layer sequence of light-emitting diode chips 21, 22 from FIG. 3C.

In the third light-generating region C, the contact structure 25 is applied continuously or substantially continuously, wherein the plated-through holes from FIG. 3C are disregarded in FIGS. 4A to 4D. The gaps 26, which are strip-shaped according to FIGS. 4A, 4B and 4D, can be aligned parallel to the longitudinal direction x or parallel to the transverse direction y. A light transmissivity of the cover emitter regions 22 in the second light-generating region B is determined by means of a density and/or shape and/or size of the gaps 26, see FIGS. 4A and 4B. According to FIG. 4C, the contact structure 25 is continuous and the gaps 26 are formed by holes in the contact structure 25.

In FIGS. 4A to 4D, the gaps 26 are distributed homogeneously over the entire second light-generating region B in each case. Alternatively, it is possible for gradients to be present, so that, for example, a surface area of the gaps 26 decreases in the direction away from the third light-generating region C.

In the exemplary embodiments of FIGS. 5 to 9, the lighting devices 1 each have at least one optical element 71. FIGS. 5 to 9 show the arrangement of the phosphor layer 4 from FIG. 2A, but can also be transferred to the arrangements of FIG. 2B or 2C.

Figure 5:
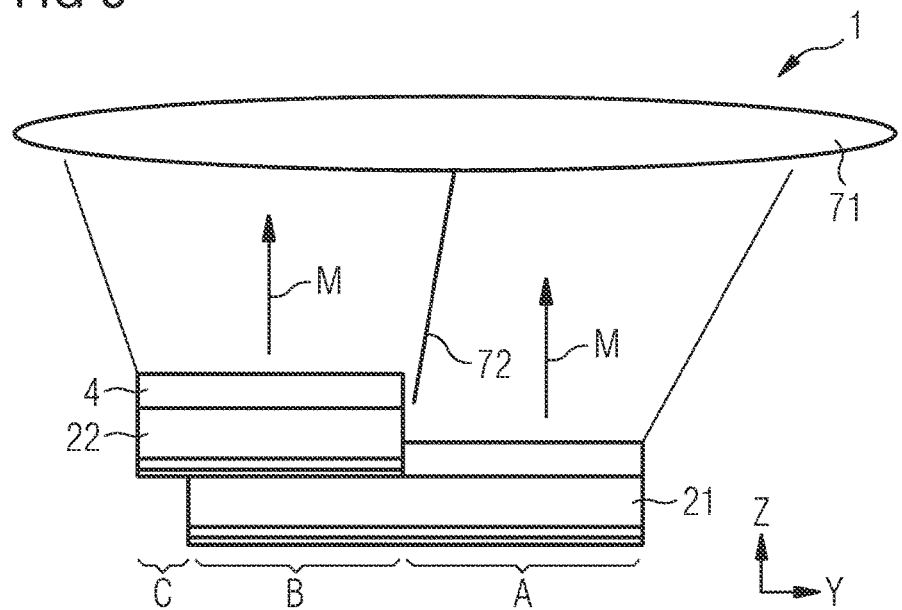

According to FIG. 5, the common optical element 71, which is designed as a converging lens, is arranged downstream of the light-emitting diode chips 21, 22. Since the base chips 21 are located further away from the optical element 71 than the cover emitter regions 22, different imaging properties are obtained. In particular, radiation of the base chip 21 is focused more strongly by the optical element 71 than light from the cover emitter regions 22. Optionally, the separation element 72 is located between the first light-generating region A and the second light-generating region B.

As in all other exemplary embodiments, it is also possible for an additional, not shown diaphragm to be present in the beam path. In this way, a standard illumination, for instance according to the ECE standard, is made possible in a simpler manner.

Figure 6:
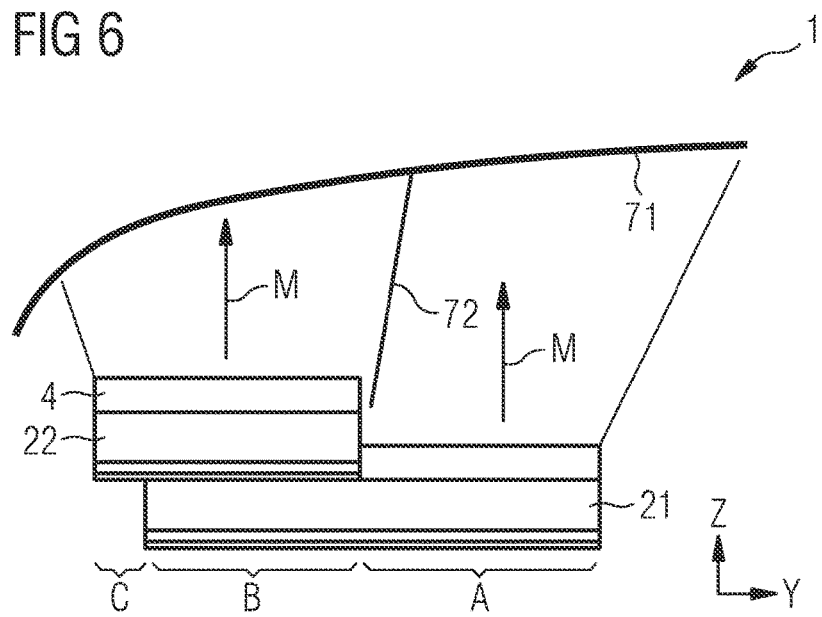

According to FIG. 6, the optical element 71 is realized by a paraboloid mirror. In this way, different imaging properties can be achieved for the light-generating regions A, B, C.

According to FIG. 7, the main emission directions M are modified by the separation element 72 to main emission directions M'. For this purpose, the separation elements 72a, 72b are realized as prisms. The separation elements 72a, 72b and preferably also the optical elements 71a, 71b extend along the longitudinal direction x (not shown in FIG. 7) in a continuous manner with an unchanged cross section along the light-emitting diode chips 21, 22. Via the separation elements 72a, 72b, the light from the light-generating regions A, B, C can be directed in a targeted manner onto the optical elements 71a, 71b, which can in each case be designed in the shape of a lens.

Unlike in FIG. 7, the optical element 71 can also be designed in one piece, as viewed approximately in cross section as a double converging lens, see FIG. 8.

Figure 9:
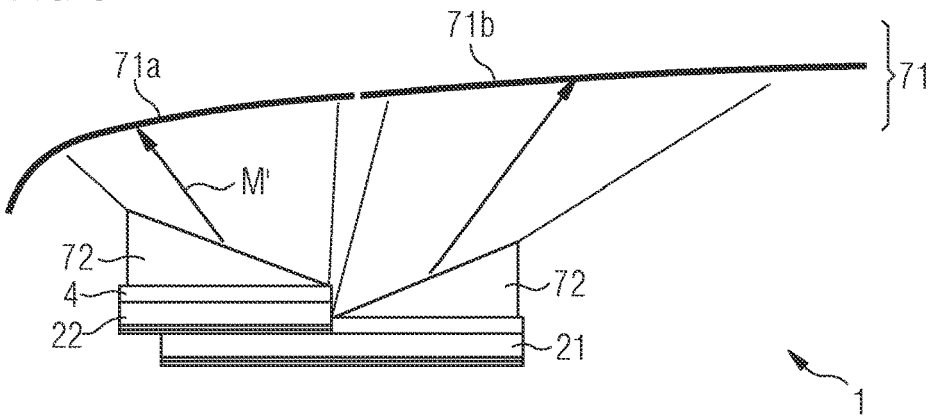

FIG. 9 illustrates that the optical element 71 is composed of different reflecting regions 71a, 71b. The regions 71a, 71b can have different curvatures. Alternatively or additionally, it is possible for the regions 71a, 71b to differ in their coating; this can be the case with regard to their spectral properties and/or with regard to their reflective properties. For example, coatings that reflect diffusely or specularly can be used.

Figure 10:
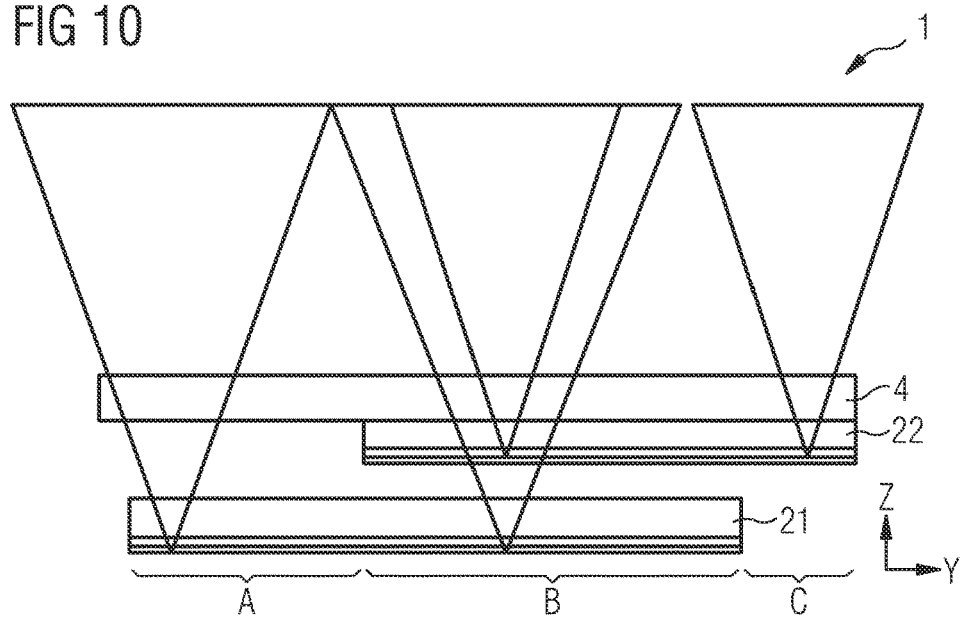

The sectional representation of FIG. 10 illustrates that different emission characteristics result from the light-generating regions B, C. In particular, a more diffuse emission of the light of the at least one base chip 21 takes place in the light-generating region B by means of suitable optical elements, see FIGS. 5 to 9. Thus, the imaging properties can be set specifically.

In FIGS. 11A to 11B, 12A to 12B and 13A to 13B, schematic plan views of the lighting device 1 in the switched-on state are shown in the figure parts A in each case. The lighting device 1 is designed in particular as explained in conjunction with FIGS. 1A to 1G. Associated illumination patterns on a roadway 10, for example a road, are illustrated in the figure parts B.

Figure 11A:
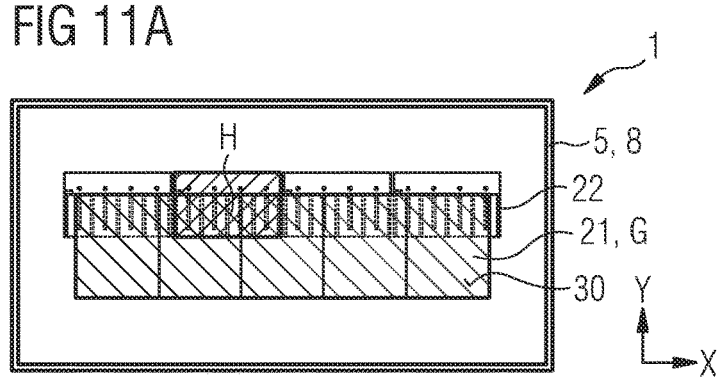
Figure 11B:
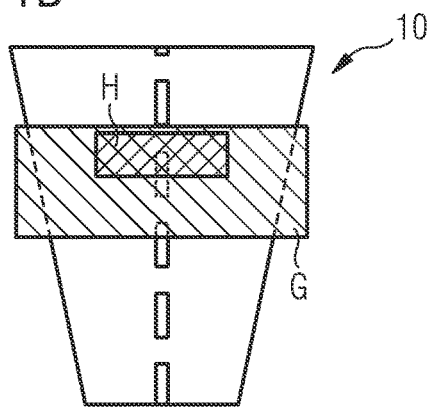

In FIGS. 11A to 11B it can be seen that a region for a basic illumination G is realized by the base chips 21 together. An additional illumination H is achieved in a further region by one of the cover emitter regions 22. The region with the additional illumination H thus appears brighter.

Figure 12A:
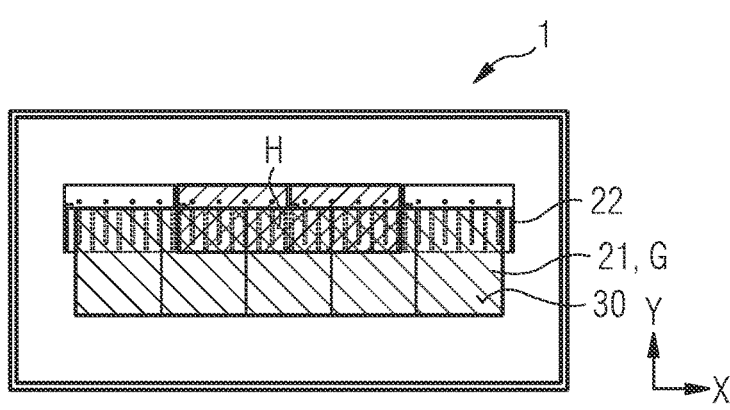
Figure 12B:
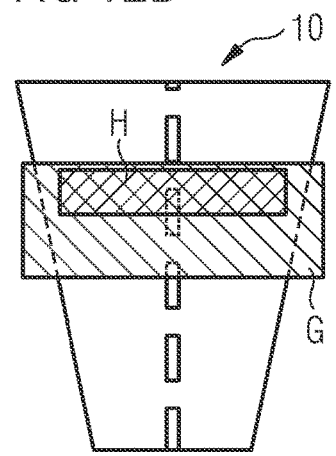

According to FIGS. 12A to 12B, two of the cover emitter regions 22 are switched on, so that the additional illumination H covers a larger region. As in FIGS. 11A to 11B, the additional illumination H lies within the basic illumination G.

Figure 13A:
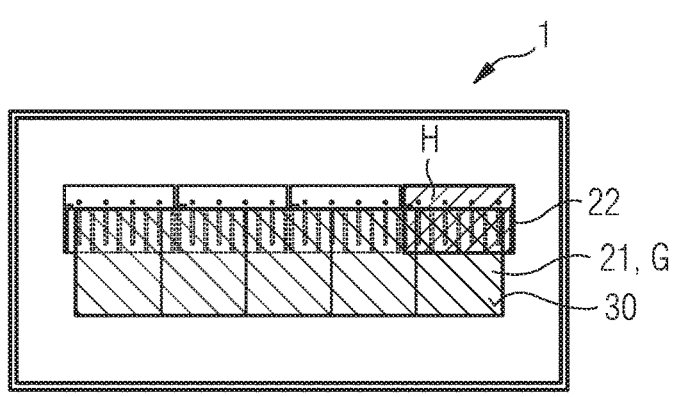
Figure 13B:
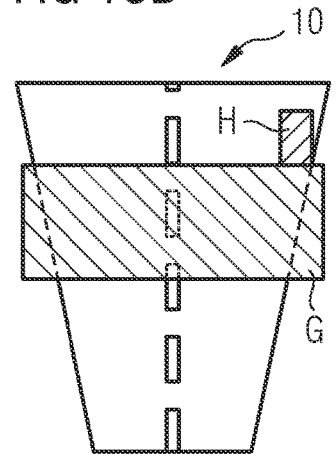

FIGS. 13A to 13B illustrates that, in particular by means of the third light-generating region C, an additional illumination H outside the basic illumination G can be realized. This can be achieved, for example, by means of suitable optical elements. For this purpose, the optical elements from FIGS. 5 to 9 can also have a respective non-shown, separate third region for the third light-generating region C.

Figure 14:
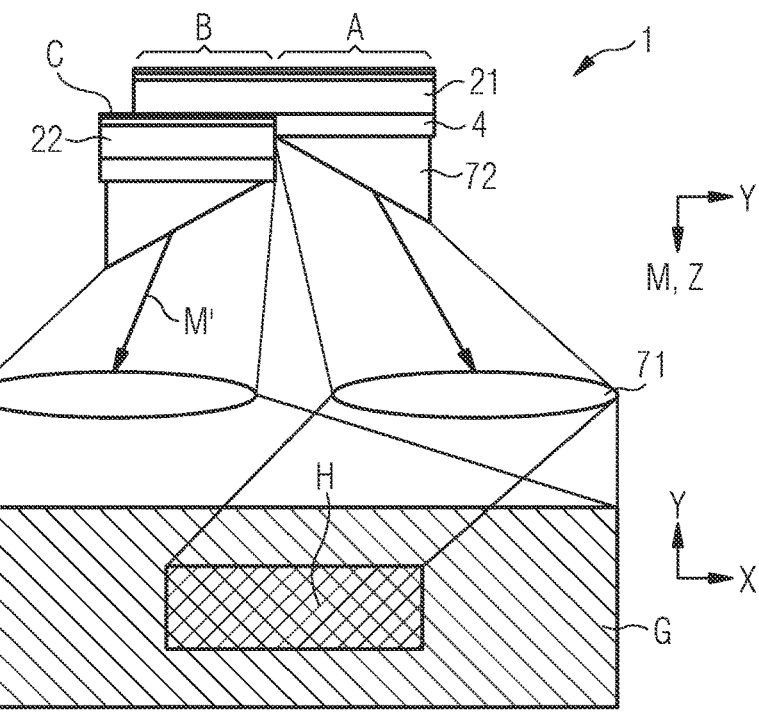

This is illustrated once again in the schematic illustration of FIG. 14 for the first light-generating region A and the second light-generating region B. The light-generating regions A, B, C are not spatially separated sharply, but rather have a specific radiation pattern and overlap behavior concerning the emission distribution characteristic for the associated light-generating region A, B, C. By means of the phosphor layers 4 with unequal heights along the main emission directions M, these are located at different distances from a focal plane of the optical element 71. Thus, there is a different focusing of the partial light sources. When using a common optical element 71, the result is in particular a narrower emission for the lower plane and a wider emission characteristic for the upper plane.

As an alternative, as in all other exemplary embodiments, it is possible that the basic illumination G is not generated by the base chips 21, but by the cover emitter regions 22. Accordingly, the additional illumination H is then provided by the cover emitter regions 22 and not by the base chips 21, as is also possible in all other exemplary embodiments.

Figure 15A:
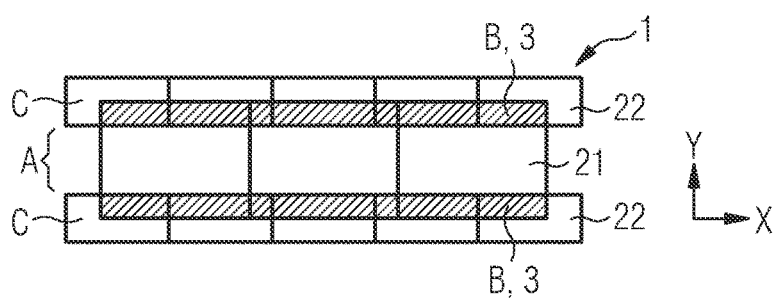
Figure 15B:
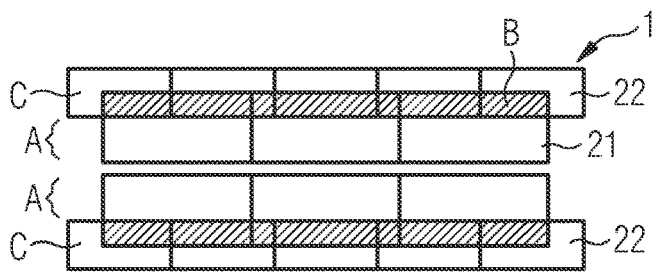
Figure 15C:
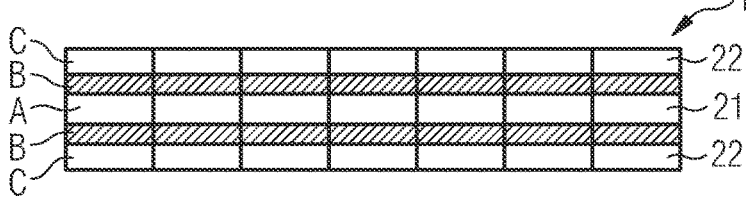

FIGS. 15A to 15C illustrates schematic plan views of further exemplary embodiments of the lighting device 1. According to FIG. 15A, two rows of the cover emitter regions 22 are present, in particular in the form of two cover chips, which each cover one edge of the one row with the base chips 21. In this case, the overlap region 3, B is formed as a strip. The second light-generating region B is framed by the third light-generating region C in a C-shaped manner.

In the exemplary embodiment of FIG. 15B, two rows of the base chips 21 are present, each of which is associated with a row of the cover emitter regions 22. The arrangement of FIG. 15B thus corresponds to a duplicated and mutually mirrored arrangement of the light-emitting diode chips 21, 22 as illustrated in FIG. 1A, for example.

As in all other exemplary embodiments, it is possible, see FIG. 15C, that the base emitter regions are not projecting from the cover emitter regions 22 along the longitudinal direction x, but that the base emitter regions and the cover emitter regions are flush with one another along the longitudinal direction x. All the light-generating regions A, B, C are thus of strip-shaped design. The same can apply to all other exemplary embodiments. It can likewise apply that the base emitter regions project beyond the cover emitter regions 22 on one side or on two sides along the longitudinal direction x.

As illustrated in particular in conjunction with FIGS. 11A to 11B, 12A to 12B and 13A to 13B, the lighting device 1 can serve as a headlight in a motor vehicle. In this case, preferably exactly five of the base emitter regions and exactly four of the cover emitter regions 22 are present. In other applications, for example in general lighting or as flash lights in mobile telephones, the same number of light-emitting diode chips can be used, or different numbers thereof.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. The relative thickness ratios, length ratios and positions of the drawn components relative to one another are likewise correctly reproduced in the figures, unless indicated otherwise.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2017 100 705.9, the disclosure content of which is hereby incorporated by reference.

LIST OF REFERENCE SIGNS 1 lighting device
21 base chip/base emitter region
22 cover chip/cover emitter region
23 growth substrate
24 active layer
25 contact structure
26 gap in the contact structure
28 lower side
29 plated-through hole
3 overlap region
30 light exit side
31 first electrical contact structure for the p-side
32 second electrical contact structure for the n-side
33 electrical connection surface
34 contact web of the second electrical contact structure
41 surface contact
42 contact pin
44 through-connection
4 phosphor layer
5 reflector potting
6 planarization layer
61 support layer
71 optical element
72 optical separation element
8 support
9 electrical contacting
10 roadway, road
A first light-generating region
B second light-generating region
C third light-generating region
G basic illumination
H additional illumination
M main emission direction
M' modified main emission direction
W growth direction of the semiconductor layer sequence
x longitudinal direction
y transverse direction
z growth direction

The invention claimed is:

1. A lighting device comprising at least one base chip, a plurality of cover emitter regions, and at least one optical element, wherein
the at least one base chip and the plurality of cover emitter regions are electrically controlled independently of one another and have main emission directions oriented parallel to one another,
the plurality of cover emitter regions are arranged in a partially overlapping manner with the at least one base chip, so that an overlap region is formed and the at least one base chip radiates through the plurality of cover emitter regions during operation,
the plurality of cover emitter regions are located in a common plane perpendicular to the main emission directions,
the optical element is arranged downstream of the at least one base chip as well as the plurality of cover emitter regions along the main emission directions, and
the optical element has different imaging properties for the at least one base chip than for the plurality of cover emitter regions.

2. The lighting device according to claim 1, in which the at least one base chip and the plurality of cover emitter regions each have a continuous, coherent active layer for generating light by means of electroluminescence, so that the at least one base chip radiates through the active layers of the plurality of cover emitter regions,
wherein a distance between the at least one base chip and the plurality of cover emitter regions along the main emission directions is at most 25% of a mean edge length of the at least one base chip.

3. The lighting device according to claim 1, in which the least one base chip comprises a plurality of the base chips which are mounted in a common plane perpendicular to the main emission directions, wherein
the plurality of base chips and the plurality of cover emitter regions are arranged closely next to one another in their respective plane,
the lighting device has no further light sources apart from the plurality of base chips and the plurality of cover emitter regions, and the plurality of cover emitter regions and the plurality of base chips are each arranged along one or along two straight lines.

4. The lighting device according to claim 1, in which all the plurality of cover emitter regions are arranged in a single cover chip, which is a light-emitting diode chip having a continuous, transparent growth substrate,
wherein the at least one base chip is a single base chip formed by a segmented light-emitting diode chip having a plurality of base emitter regions.

5. The lighting device according to claim 1, in which the plurality of cover emitter regions have a reflective contact structure on a side facing the at least one base chip,
wherein the reflective contact structure has a plurality of gaps in the overlap region and the at least one base chip emits its radiation through these gaps and through the plurality of cover emitter regions, and
wherein the reflective contact structure is flat, uninterrupted and opaque outside the overlap region.

6. The lighting device according to claim 1, in which the plurality of cover emitter regions and the at least one base chip generate light of the same color during operation,
wherein at least one phosphor layer is arranged downstream of the at least one base chip and the plurality of cover emitter regions.

7. The lighting device according to claim 6, in which the phosphor layer has a step, which lies at a boundary between the overlap region and remaining regions of the at least one base chip, so that the phosphor layer is located at the plurality of cover emitter regions at a position along the main emission directions different than above the at least one base chip.

8. The lighting device according to claim 6, further comprising at least one light-transmissive planarization layer, which is arranged on a side of the at least one phosphor layer facing away from the at least one base chip and is arranged between the at least one phosphor layer and the at least one base chip, so that the lighting device has a flat light exit side, which is formed by the at least one phosphor layer and the at least one light-transmissive planarization layer.

9. The lighting device according to claim 1, in which a first surface area of 15% to 45% of the at least one base chip is covered by the plurality of cover emitter regions,
wherein the overlap region accounts for a second surface area at the plurality of cover emitter regions between 40% and 80% inclusive, and the first surface area is smaller than the second surface area.

10. The lighting device according to claim 1, wherein, in plan view, the at least one base chip is formed in a rectangular or square shape and the plurality of cover emitter regions project beyond the at least one base chip continuously along one side, in part along two adjacent sides and do not project beyond the remaining side.

11. The lighting device according to claim 1, further comprising a reflector potting, wherein the at least one base chip and the plurality of cover emitter regions are surrounded in direct contact all around by the reflector potting when viewed in plan view, and
wherein all electrical connections of the at least one base chip and of the plurality of cover emitter regions point in the same direction, so that the at least one base chip and the plurality of cover emitter regions are each at least one flip-chip with a transparent growth substrate.

12. The lighting device according to claim 1, wherein the optical element is formed by exactly one lens or by exactly one reflector.

13. The lighting device according to claim 1, further comprising at least one optical separation element, by means of which a beam splitting between light from the overlap region, light from the plurality of cover emitter regions outside the overlap region and light from the at least one base chip outside the overlap region is formed.

14. A method of manufacturing a lighting device, the lighting device comprising at least one base chip, a plurality of cover emitter regions, and at least one optical element, the method comprising:
arranging the plurality of cover emitter regions to have partial overlap with the at least one base chip, so that an overlap region is formed and the at least one base chip radiates through the plurality of cover emitter regions during operation, wherein the at least one base chip and the plurality of cover emitter regions are arranged to be controlled independently of one another and have main emission directions oriented parallel to one another,
arranging the plurality of cover emitter regions in a common plane perpendicular to the main emission directions,
arranging the optical element downstream of the at least one base chip, and
arranging the plurality of cover emitter regions along the main emission directions, wherein the optical element has different imaging properties for the at least one base chip than for the plurality of cover emitter regions, wherein the at least one base chip is configured to be operated alone at times and jointly at times with at least one of the plurality of cover emitter regions such that a basic illumination is realized by the at least one base chip and a punctiform additional illumination is realized by the cover emitter regions.

15. A lighting device comprising at least one base chip and a plurality of cover emitter regions, wherein
the at least one base chip and the plurality of cover emitter regions are electrically controlled independently of one another and have main emission directions oriented parallel to one another,
the plurality of cover emitter regions are arranged in a partially overlapping manner with the at least one base chip, so that an overlap region is formed and the at least one base chip radiates through the plurality of cover emitter regions during operation, and
the plurality of cover emitter regions are located in a common plane perpendicular to the main emission directions.

* * * * *